(12) United States Patent
Swaffield et al.

(10) Patent No.: US 9,613,751 B2
(45) Date of Patent: Apr. 4, 2017

(54) COIL SUPPORT MEMBERS

(71) Applicant: GE Energy Power Conversion Technology Ltd, Warwickshire (GB)

(72) Inventors: David John Swaffield, Warwickshire (GB); Martin Richard Ingles, Warwickshire (GB)

(73) Assignee: GE ENERGY POWER CONVERSION TECHNOLOGY LTD, Warwickshire (GB)

(*) Notice: Subject to any disclaimer, the term of this patent is extended or adjusted under 35 U.S.C. 154(b) by 121 days.

(21) Appl. No.: 14/353,783

(22) PCT Filed: Oct. 8, 2012

(86) PCT No.: PCT/EP2012/069841
§ 371 (c)(1),
(2) Date: Apr. 24, 2014

(87) PCT Pub. No.: WO2013/060568
PCT Pub. Date: May 2, 2013

(65) Prior Publication Data
US 2014/0287927 A1  Sep. 25, 2014

(30) Foreign Application Priority Data
Oct. 24, 2011  (EP) .................................. 11186304

(51) Int. Cl.
*H01F 41/04* (2006.01)
*H01F 27/06* (2006.01)
(Continued)

(52) U.S. Cl.
CPC .......... *H01F 41/04* (2013.01); *B29C 39/003* (2013.01); *B29C 39/025* (2013.01); *B29C 39/10* (2013.01);
(Continued)

(58) Field of Classification Search
None
See application file for complete search history.

(56) References Cited

U.S. PATENT DOCUMENTS

| | | | | |
|---|---|---|---|---|
| 4,895,831 A | * | 1/1990 | Laskaris | ................ H01F 6/065 |
| | | | | 174/15.5 |
| 5,917,393 A | * | 6/1999 | Kupiszewski | ............ H01F 6/06 |
| | | | | 174/125.1 |

(Continued)

FOREIGN PATENT DOCUMENTS

| | | |
|---|---|---|
| CN | 100526907 C | 8/2009 |
| EP | 2234248 A1 | 9/2010 |

(Continued)

OTHER PUBLICATIONS

International Search Report and Written Opinion dated Apr. 19, 2013 which was issued in connection with PCT/EP2012/069841 which was filed on Oct. 8, 2012.

(Continued)

*Primary Examiner* — Colleen Dunn
(74) *Attorney, Agent, or Firm* — GE Global Patent Operation; Scott R. Stanley

(57) ABSTRACT

A method of manufacturing a coil support member in which a thermosetting or thermoplastic material is introduced into a mold cavity and hardened, wherein one or more components are positioned within the mold cavity during the manufacturing process before the thermosetting or thermoplastic material is introduced, the components are then embedded in the thermosetting or thermoplastic material and form an integral part of the coil support member, and one or more functional filler materials are added to the thermosetting or thermoplastic material to improve the thermal matching between the integral components and the thermosetting or thermoplastic material.

8 Claims, 1 Drawing Sheet

(51) Int. Cl.
| | |
|---|---|
| B29C 45/16 | (2006.01) |
| B29C 70/58 | (2006.01) |
| B29C 70/68 | (2006.01) |
| B29C 39/00 | (2006.01) |
| B29C 39/02 | (2006.01) |
| B29C 39/10 | (2006.01) |
| B29C 45/00 | (2006.01) |
| H01F 6/06 | (2006.01) |
| H02K 3/30 | (2006.01) |
| B29C 70/88 | (2006.01) |
| H01F 27/08 | (2006.01) |
| B29L 31/34 | (2006.01) |
| B29L 31/30 | (2006.01) |
| B29C 45/14 | (2006.01) |
| B29C 45/44 | (2006.01) |
| B29C 33/12 | (2006.01) |
| B29C 33/48 | (2006.01) |
| B29C 33/58 | (2006.01) |
| B29C 39/34 | (2006.01) |
| B29K 63/00 | (2006.01) |
| B29K 105/16 | (2006.01) |
| B29L 9/00 | (2006.01) |
| G01R 33/3815 | (2006.01) |
| H02K 55/04 | (2006.01) |
| H02K 1/32 | (2006.01) |
| H02K 3/52 | (2006.01) |
| H02K 15/00 | (2006.01) |
| B29K 105/20 | (2006.01) |
| G01R 33/38 | (2006.01) |
| H01F 5/02 | (2006.01) |

(52) U.S. Cl.
CPC ...... *B29C 45/0001* (2013.01); *B29C 45/0013* (2013.01); *B29C 45/14639* (2013.01); *B29C 45/14778* (2013.01); *B29C 45/1615* (2013.01); *B29C 45/1671* (2013.01); *B29C 70/58* (2013.01); *B29C 70/68* (2013.01); *B29C 70/88* (2013.01); *H01F 6/06* (2013.01); *H01F 27/06* (2013.01); *H01F 27/08* (2013.01); *H01F 41/048* (2013.01); *H02K 3/30* (2013.01); B29C 33/12 (2013.01); B29C 33/48 (2013.01); B29C 33/58 (2013.01); B29C 39/34 (2013.01); B29C 45/14065 (2013.01); B29C 45/44 (2013.01); B29K 2063/00 (2013.01); B29K 2105/16 (2013.01); B29K 2105/20 (2013.01); B29L 2009/00 (2013.01); B29L 2031/3061 (2013.01); B29L 2031/3481 (2013.01); G01R 33/3802 (2013.01); G01R 33/3815 (2013.01); H01F 5/02 (2013.01); H02K 1/325 (2013.01); H02K 3/527 (2013.01); H02K 15/00 (2013.01); H02K 55/04 (2013.01); Y02E 40/625 (2013.01)

(56) References Cited

U.S. PATENT DOCUMENTS

| | | | |
|---|---|---|---|
| 6,646,528 B2* | 11/2003 | Ehrenberg | H01F 6/06 29/599 |
| 7,154,270 B2 | 12/2006 | Arz et al. | |
| 7,814,641 B2 | 10/2010 | Du et al. | |
| 7,849,587 B2* | 12/2010 | Calvert | G01R 33/3802 29/602.1 |
| 7,987,579 B2* | 8/2011 | Rinck | H02K 1/2786 156/294 |
| 8,013,697 B2* | 9/2011 | Calvert | G01R 33/3802 29/599 |
| 8,255,024 B2* | 8/2012 | Kramer | H01L 39/16 336/207 |
| 2004/0178871 A1* | 9/2004 | Elgin, II | G01R 33/3815 335/216 |
| 2005/0168222 A1* | 8/2005 | Arz | G01R 33/3856 324/318 |
| 2006/0145548 A1* | 7/2006 | Wakita | H02K 3/24 310/54 |
| 2006/0267853 A1 | 11/2006 | Naito | |
| 2008/0208035 A1 | 8/2008 | Nistler et al. | |
| 2010/0187999 A1* | 7/2010 | Agneray | H01T 13/50 315/111.51 |
| 2011/0012698 A1* | 1/2011 | Hutton | G01R 33/3802 335/216 |
| 2013/0219701 A1* | 8/2013 | Dunckley | G01R 33/3802 29/605 |
| 2014/0274722 A1* | 9/2014 | Calvert | G01R 33/3815 505/163 |
| 2015/0061801 A1* | 3/2015 | Dunckley | G01R 33/3802 335/297 |

FOREIGN PATENT DOCUMENTS

| | | |
|---|---|---|
| JP | 57192005 A | 11/1982 |
| JP | 05328665 A | 12/1993 |
| JP | 2003282344 A | 10/2003 |
| JP | 2005110401 A | 4/2005 |
| JP | 2007159286 A | 6/2007 |
| WO | 03093853 A1 | 11/2003 |
| WO | 2004073144 A1 | 8/2004 |
| WO | 2008141741 A1 | 11/2008 |

OTHER PUBLICATIONS

European Search Report and Opinion issued in connection with corresponding EP Application No. 11186304.9 on Sep. 6, 2012.

Unofficial English Translation of Chinese Office Action issued in connection with corresponding CN Application No. 201280052375.1 on Jul. 14, 2015.

Fengxu, "The New Technique of Metallizing the Surface of Plastics and its Applications", China Academic Journal Electronic Publishing House, pp. 8-16, 1994-2016.

Unofficial English Translation of Chinese Office Action issued in connection with corresponding CN Application No. 201280052375.1 on Apr. 19, 2016.

\* cited by examiner

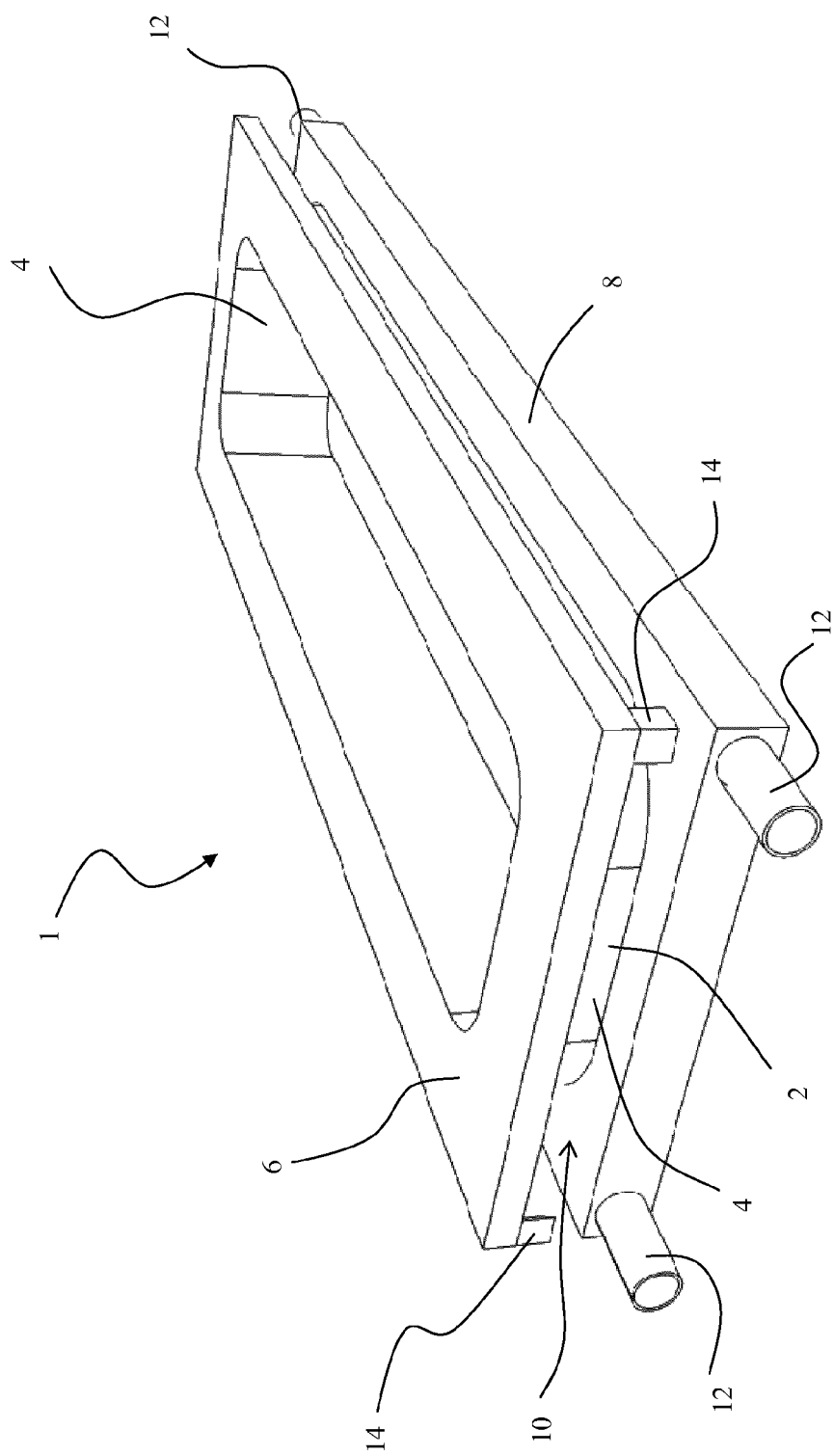

COIL SUPPORT MEMBERS

TECHNICAL FIELD

The present invention relates to coil support members (sometimes referred to as coil formers), and in particular to members that provide structural support for a coil that can be made of conventional or superconducting wire or tape, or for one or more blocks of superconducting material. The coil support members can be used in the construction of inter alia rotating electrical machines (e.g. motors or generators), magnetic resonance imaging (MRI) scanners, electro-magnets, research beam lines and particle accelerators, fault-current limiters, and magnet energy storage devices. In the case of rotating electrical machines then a plurality of coil support members can be mounted around the circumference of a rotor assembly.

BACKGROUND ART

Support members for wound coils are known and, for cryogenic applications, are typically made from stainless steel which is difficult and expensive to machine.

SUMMARY OF THE INVENTION

The present invention provides a method of making an improved coil support member. A thermosetting or thermoplastic material is introduced into a mould cavity and hardened to produce the coil support member.

Any suitable manufacturing process can be used to introduce the thermosetting or thermoplastic material into the mould cavity, but typical options might include injection moulding where the material is forced into the mould cavity under pressure using injection moulding equipment; a casting process where the material is poured into the mould cavity, e.g. from a header vessel or the like; and a compression moulding process where the material is poured into the mould cavity and an additional moulding die is used to apply pressure to the material before it hardens to form the coil support member. Using a moulding or casting process to produce the coil support member instead of a conventional machining process means that it can have more complex geometries, particularly at the surfaces that actually contact and provide mechanical support for the wound coil. The use of a thermosetting or thermoplastic material instead of stainless steel means that the thermal properties of the coil support member can also be made to substantially match the thermal properties of the coil and any integral components (see below) which significantly reduces structural problems in the support. Coil support members formed using a thermosetting or thermoplastic material are relatively lightweight and cost-effective to produce. They also have improved heat transfer properties without the problems associated with electrical eddy current paths that are typically found in copper or aluminium sheets or any associated thermal bus, and provide useful electrical isolation.

The coil support member can be formed by a single- or multi-stage manufacturing process. In a single-stage process the shape of the mould cavity will substantially define the shape of the finished coil support member. The thermosetting or thermoplastic material is introduced into the mould cavity, hardened and the coil support member is removed from the mould cavity. The coil support member may need to be subjected to one or more final finishing, machining or post-production processes as described in more detail below. However, the shape of the coil support member is substantially defined by the shape of the mould cavity meaning that structures with complex geometry can be manufactured in a quick and cost-effective manner.

In a multi-stage process only the shape of the final mould cavity will substantially define the shape of the finished coil support member. The other mould cavities will define layers or parts of the coil support member, which can optionally be designed to provide different properties to the finished support member, or to allow a specific support member to be manufactured if this is not possible using a single-stage process. In a typical multi-stage process the layer or part produced during the first stage is allowed to harden then removed from the mould cavity and placed in the mould cavity for the next stage, and so on. Each stage will therefore define a different layer or part of the finished coil support member. Any number of stages can be used.

The previously-formed layer or part can be positioned within the mould cavity for the next stage using one or more positioning members. Each layer or part can include structural features (e.g. 'keying' features) which allow the thermosetting or thermoplastic material introduced in a subsequent stage of the manufacturing process to mechanically bond to it. This will be in addition to any chemical bonding that will typically take place between the different layers or parts of the coil support member, i.e. as the thermosetting or thermoplastic material introduced into the mould cavity bonds with an underlying layer or adjacent part produced during a previous stage.

The choice of thermosetting or thermoplastic material will depend on the intended application and the desired properties of the coil support member. The thermosetting or thermoplastic material may include a hardener that is activated to harden or cure the material. For example, a suitable material for forming the coil support member might be a synthetic resin or epoxy and a hardener, together with an optional component to adjust the viscosity of the material. Functional filler materials may be added to the thermosetting or thermoplastic material to improve or alter one or more of its thermal, mechanical, electrical and magnetic properties. For example, filler materials such as inter alia glass, silica, quartz, alumina, aluminium nitride, boron nitride and titanium oxide, micas, clays, metals, superconducting materials, glass or polymeric-based hollow fillers can be added to improve or alter the basic physical properties of the thermosetting or thermoplastic material. Magnetic filler materials can also be added to divert or channel magnetic flux through the coil support member in use and may be distributed accordingly. The filler materials can improve the thermal matching of the thermosetting or thermoplastic material with any integral components (see below), i.e. to modify the coefficient of thermal expansion of the thermosetting or thermoplastic material so that it is a closer match with the coefficient of thermal expansion of any integral component (s). The thermal matching will, in an embodiment, be across the temperature range from room (or ambient) temperature to the operational temperature of the coil support member and close enough to prevent debonding or cracking along the interface between the hardened thermosetting or thermoplastic material and the integral components. A combination of different filler materials (or different types or sizes of the same filler material—it will be readily appreciated that many materials are available as powders with different particle sizes, flakes, fibres, tubes etc. that can provide different properties to the thermosetting or thermoplastic material) can be added. The filler materials can be substantially evenly distributed through the thermosetting or thermoplastic material or unevenly distributed so that they are concentrated at, or isolated to, certain parts or areas of the finished coil support member. Filler materials can reduce or eliminate known problems such as shrinkage and cracking of the thermosetting or thermoplastic material during hardening or curing.

The functional filler materials may be added to the thermosetting or thermoplastic material before it is introduced into the mould cavity or as it is being introduced into the mould cavity. For a substantially even distribution of filler material then some form of pre-mixing with the thermosetting or thermoplastic material may be desirable. A powder injection moulding (PIM) process can be used where suitable powders are pre-mixed with a binder (e.g. a thermoplastic polymer material) before being fed into injection moulding equipment. The functional filler materials may also be added to the mould cavity after the thermosetting or thermoplastic material has been introduced but before it has completely hardened or cured. This may allow specific parts or areas of the coil support member to be doped with filler materials in a more controlled manner. Different filler materials may be added at different times during the manufacturing process, including during the curing process.

In a multi-stage manufacturing process then a different thermosetting or thermoplastic material and/or a different filler material, combination of filler materials or no filler material can be used for different layers or parts of the coil support member. The filler material or combination of filler materials can be deliberately selected to achieve a different characteristic or property, such as improved thermal conductivity, mechanical strength or rigidity, in each layer or part. Many filler materials are expensive so the manufacturing process will typically be more cost effective if they are only used in the parts or layers of the coil support member where they actually provide a technical improvement. In some stages of the manufacturing process only a thermosetting or thermoplastic material will be used, i.e. no filler materials are necessary.

One or more components can be positioned within the mould cavity during the manufacturing process so that they are integrally formed with the finished coil support member. In other words, each component is literally embedded within the thermosetting or thermoplastic material to define an integral part of the finished support member. In a multi-stage manufacturing process then different components can be positioned at each stage.

Each component can be positioned within the mould cavity using one or more positioning members which support the component at the correct location. The positioning members can be made of any suitable material, e.g. metal, ceramic or glass fibre, and can be embedded, themselves, within the thermosetting or thermoplastic material, or removed after the material has hardened. This can be achieved by coating each positioning member with a suitable mould release agent so that it does not bond with the thermosetting or thermoplastic material when it is introduced into the mould cavity. In a multi-stage manufacturing process then any empty space or void left by a positioning member that has been removed can be filled with thermosetting or thermoplastic material during a subsequent stage. This provides a way of completely embedding a component within the body of the coil support member.

Examples of components that can be integrally formed with the finished coil support member would include inter alia electrical components such as terminal blocks to which the ends of the coil are attached; mechanical components such as support structures or bracing members that are designed to increase the strength or rigidity of the coil support member, and mounting or fixing structures that allow the coil support member to be mechanically connected to external equipment such as the rotor assembly of an electrical machine, for example; diagnostic components such as temperature sensors and strain gauges; and thermal components—which are particularly useful if the coil support member is to be operated at a cryogenic temperature, e.g. as part of a rotor assembly for a superconducting electrical machine—such as thermally conductive buses, coolant pipes for the circulation of cooling fluid, or connectors to which external coolant pipes can be releasably or permanently connected. The components can be made of metal, ceramic etc. Some components can be formed over multiple stages of the manufacturing process with individual layers of conductive and dielectric materials being integrated into the coil support member to form components such as a thermal bus or electrical connections.

A coil can be wound around the finished coil support member, e.g. by placing the coil support member on a suitable coil winding assembly. The coil can be formed from any conventional or superconducting wire or tape. The coil support member can include an external support surface that contacts and supports the coil in its desired shape during the winding process and when the coil support member is in use. The wound support can then be subjected to a final vacuum pressure impregnation (VPI) process to seal the coil in a suitable synthetic resin. It is also possible for a pre-formed coil to be positioned within the mould cavity like any other component so that it is integrally formed with the coil support member and embedded within the thermosetting or thermoplastic material. The pre-formed coil may be formed using any conventional winding process and may optionally be subjected to a VPI process before being positioned within the mould cavity. In other cases one or more blocks of superconducting material can be positioned with the mould cavity instead of a coil.

Structural features of the coil support member can be formed during the manufacturing process, either by positioning components within the mould cavity that are subsequently removed, e.g. by coating them with a suitable mould release agent or where they melt during any subsequent curing process to leave an empty space or void within the body of the coil support member, or by appropriate shaping of the mould cavity itself. Structural features which might conveniently be formed in this way would include internal conduits for the circulation of cooling fluid or for electrical cables to allow a connection to be made to integral electrical components. Structural features of the coil support member can be metalized in a post-production process to allow external components to be brazed to them. For example, if an internal conduit is formed in the coil support member then the structure may include one or more projecting parts that each define an end of the conduit, the projecting parts being metalized by any suitable process (e.g. a deposition or plating process) so that external metal coolant pipes or connecters for the coolant pipes can be brazed to the connecting parts. The thermal conductivity of at least the part of the coil support member that contains the internal conduits (or the embedded coolant pipe components mentioned above) can be improved by the use of suitable filler materials so that heat is efficiently removed from the coils. In practice, this can remove the need for a metal thermal bus in which problematic eddy currents can be induced.

A vacuum can be applied to the mould cavity before the thermosetting or thermoplastic material is introduced. The vacuum can also be maintained or applied while the thermosetting or thermoplastic material is being introduced into the mould cavity.

The 'cure schedule' for hardening or curing the thermosetting or thermoplastic material after it has been introduced into the mould cavity will depend on the specific material that is used, together with any additives such as filler materials etc. Curing can take place at room temperature or, if elevated temperatures are required, the entire mould can be placed in a suitable oven or autoclave.

The present invention further provides a moulded coil support member made from a hardened (or cured) thermosetting or thermoplastic material.

The coil support member can also include one or more functional filler materials, optionally to improve or alter one or more of the thermal, mechanical, electrical and magnetic properties of the support member. The amount of filler material will depend on the particular application but as little as about 5% by weight of the thermosetting or thermoplastic material may give an effective improvement.

As explained above, different components can be integrally formed with the coil support member during the manufacturing process, i.e. embedded within the thermosetting or thermoplastic material.

A coil can be wound around the coil support member or a pre-formed coil can be integrally formed with the coil support member during its manufacturing process. The coil support member can also be used to support one or more blocks of superconducting material.

The coil support member can include one or more structural features such as internal conduits for the circulation of cooling fluid or for electrical cables. Structural features of the coil support member can be metalized in a post-production process to allow external components to be brazed to them.

One or more coil support members can be mounted or fixed to external equipment. For example, a plurality of coil support members could be mounted around the circumference of a rotor assembly for a rotating electrical machine.

DRAWING

FIG. 1 shows a perspective view of a coil support member in accordance with the present invention.

Although the following description concentrates on a coil support member for a superconducting coil (i.e. a coil made of superconducting wire or tape) that is intended to be installed around the rotor assembly of a rotating electrical machine such as a motor or generator, it will be readily appreciated that the present invention has wider application and can be used with coils made of a conventional material such as copper, and for installation to other equipment such as magnetic resonance imaging (MRI) scanners, electromagnets, research beam lines and particle accelerators, fault-current limiters, and magnet energy storage devices, for example.

A coil support member 1 is made from a synthetic resin material (e.g. an epoxy) that is introduced into a mould cavity and cured. The coil support member 1 includes an external surface 2 that supports a superconducting coil (not shown) and in particular has curved end regions 4 that are shaped to provide support to the endwindings of the superconducting coil. An upper plate 6 and a lower plate 8 overhang the external surface 2 such that the coil is positioned in the space 10 between the upper and lower plates.

Tubular projecting parts 12 are integrally formed with the lower plate 8 and are adapted to be connected to external coolant pipes (not shown). The projecting parts 12 are in fluid communication with one or more internal coolant passages or conduits that extend within the lower plate 8 and through which cryogenic cooling fluid is circulated to cool the coil support member 1 and maintain the superconducting coil below its superconducting temperature. Any suitable mounting or fixing blocks (not shown) can be integrally formed with the lower plate 8 to allow a plurality of coil support members 1 to be installed to the rotor assembly of a rotating electrical machine. For example, the fixing blocks might include one or more internally screw-threaded bores that enable the coil support member 1 to be bolted to the rotor assembly.

A pair of terminal blocks 14 are integrally formed with the upper plate 6. The ends of the superconducting coil are attached to the terminal blocks to enable an external electrical connection to be made.

The coil support member 1 is produced in a single-stage process which allows the coil support member to have a complex geometry, particular in the region of the external surface 2 that supports the superconducting coil. However, it will be readily appreciated that the coil support member could be formed in a multi-stage process where at least a thermal core part and a mechanically rigid fixing part are formed sequentially using a series of mould cavities and with the option for different synthetic resins and/or functional fillers to be used at different stages. The thermal core part could be adjacent the internal cooling passages and include the external surface 2 and could be doped with filler materials that improve its thermal conductivity. The mounting or fixing blocks (not shown) could be embedded within the mechanically rigid fixing part being defined for example by at least part of the lower plate 8. The mechanically rigid fixing part could include rigid bracing or support structure components and/or could be doped with filler materials that improve its mechanical strength. Functional fillers can be used to improve thermal matching between the synthetic resin material and the various embedded components, i.e. to modify the coefficient of thermal expansion of the hardened synthetic resin so that it is a closer match with the coefficients of thermal expansion of the components The thermal matching will be across the temperature range from room temperature to the operational temperature of the coil support member. This ensures that the components and the synthetic resin material remain bonded during both cooling and operational phases and prevents cracking along the interfaces when the coil support member 1 undergoes temperature variations during operation.

The mould cavity defines the shape of the finished coil support member 1. The terminal blocks 14 can be positioned within the mould cavity at a suitable location using one or more positioning members before the synthetic resin is introduced into the mould cavity so that the terminal blocks are embedded in the synthetic resin forming the upper plate 6 during the manufacturing process. Although not shown, other components can be similarly embedded in the synthetic resin by positioning them within the mould cavity. The tubular projecting parts 12 can be formed by embedding metal coolant pipes in the synthetic resin forming the lower plate 8 so that an end part of each pipe is exposed. The internal coolant passages or conduits can also be formed by metal coolant pipes embedded within the lower plate 8. External coolant pipes can be releasably or permanently connected to the exposed ends of the embedded pipes in a conventional manner. The tubular projecting parts 12 can also be formed from the synthetic resin (i.e. as an integral part of the lower plate 8) by using an appropriate shaped mould cavity and with the internal space or void of each part, and optionally also the internal coolant passages or conduits in the lower plate 8, being formed by the use of spacer components positioned in the mould cavity and which are pre-coated with a release agent so that they can be released from the surrounding synthetic resin to leave an empty space or void once it has cured and the coil support member is removed from the mould. If the tubular projecting parts 12 are formed from synthetic resin then they can be metalized by a deposition or plating process, for example, so that external metal coolant pipes or any associated connectors can be brazed to them.

To manufacture the coil support member 1 the various components (e.g. the metal pipes used to form the tubular projecting parts 12 and any internal coolant passages, the terminal blocks 14 etc.) are suitably positioned within the mould cavity using one or more positioning members. The synthetic resin is then introduced into the mould cavity using conventional injection moulding equipment and is allowed to harden by following an appropriate cure schedule, which may optionally require the use of an elevated temperature. The finished coil support member 1 is then removed from the mould and subjected to any post-production process. One or more functional fillers can be added to the synthetic resin to improve or alter the properties of the coil support member 1 as described in more detail above.

A superconducting coil is wound on to the finished coil support member 1 in a separate winding process which is conventional and is not described further. However, it will be appreciated that a pre-formed superconducting coil can be positioned within the mould cavity so that it is embedded within the coil support member 1 between the upper and lower plates 6, 8.

The written description uses examples to disclose the invention, including the best mode, and also to enable any person skilled in the art to practice the invention, including making and using any device or system and performing the incorporated method. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial difference from the literal language of the claims.

What is claimed is:

1. A method in which a thermosetting or thermoplastic material is introduced into a mould cavity and hardened to produce a coil support member, the method comprising:
    positioning one or more components within the mould cavity before the thermosetting or thermoplastic material is introduced;
    thermal matching the thermosetting or thermoplastic material with the one or more components including adding one or more functional filler materials to the thermosetting or thermoplastic material modifying a coefficient of thermal expansion of the thermosetting or thermoplastic material to better match with a coefficient of thermal expansion of the one or more components; and
    defining the mould cavity so that the coil support member includes an external surface for supporting a coil wound about the coil support member.

2. The method according to claim 1, wherein each of the one or more components is positioned within the mould cavity using one or more positioning members.

3. The method according to claim 2, wherein a component and/or a positioning member is coated with a mould release agent before being positioned within the mould cavity.

4. The method according to claim 1, wherein the coil support member is formed by a multi-stage manufacturing process in which each stage forms a layer or part of the coil support member.

5. The method according to claim 4, wherein a different thermosetting or thermoplastic material and/or a different filler material, combination of filler materials or no filler material is used in different stages of the multi-stage manufacturing process.

6. The method according to claim 1, further comprising winding a coil around the coil support member.

7. The method according to claim 1, wherein a pre-formed coil or one or more blocks of superconducting material is positioned within the mould cavity before the thermosetting or thermoplastic material is introduced.

8. The method according to claim 1, wherein one or more structural features of the coil support member are metalized in a post-production process.

* * * * *

UNITED STATES PATENT AND TRADEMARK OFFICE
CERTIFICATE OF CORRECTION

PATENT NO. : 9,613,751 B2  Page 1 of 1
APPLICATION NO. : 14/353783
DATED : April 4, 2017
INVENTOR(S) : Swaffield et al.

It is certified that error appears in the above-identified patent and that said Letters Patent is hereby corrected as shown below:

On the Title Page

In Item (57), under "ABSTRACT", in Column 2, Line 3, delete "mold" and insert -- mould --, therefor.

In Item (57), under "ABSTRACT", in Column 2, Line 4, delete "mold" and insert -- mould --, therefor.

Signed and Sealed this
Sixth Day of June, 2017

Michelle K. Lee
*Director of the United States Patent and Trademark Office*